(12) United States Patent
Knapp et al.

(10) Patent No.: US 12,061,334 B2
(45) Date of Patent: Aug. 13, 2024

(54) OPTICAL SCANNING SYSTEM USING MICRO-ELECTRO-MECHANICAL SYSTEM (MEMS) MICRO-MIRROR ARRAYS (MMAs)

(71) Applicant: Raytheon Company, Tewksbury, MA (US)

(72) Inventors: David J. Knapp, Tucson, AZ (US); Gerald P. Uyeno, Tucson, AZ (US); Sean D. Keller, Tucson, AZ (US); Benn H. Gleason, Tucson, AZ (US); Eric Rogala, Tucson, AZ (US); Mark K. Lange, Tucson, AZ (US); Garret A. Odom, Tucson, AZ (US); Craig O. Shott, Benson, AZ (US); Zachary D. Barker, Marana, AZ (US)

(73) Assignee: Raytheon Company, Tewksbury, MA (US)

( * ) Notice: Subject to any disclaimer, the term of this patent is extended or adjusted under 35 U.S.C. 154(b) by 695 days.

(21) Appl. No.: 17/231,898

(22) Filed: Apr. 15, 2021

(65) Prior Publication Data

US 2023/0022548 A1    Jan. 26, 2023

(51) Int. Cl.
  *G02B 26/10*    (2006.01)
  *B81B 3/00*    (2006.01)
  *G02B 26/08*    (2006.01)

(52) U.S. Cl.
  CPC .......... *G02B 26/105* (2013.01); *B81B 3/0083* (2013.01); *G02B 26/0833* (2013.01); *B81B 2201/042* (2013.01); *B81B 2203/058* (2013.01); *B81B 2207/053* (2013.01)

(58) Field of Classification Search
  CPC .......... G02B 26/105; G02B 26/0833

USPC .......................................... 359/291
See application file for complete search history.

(56) References Cited

U.S. PATENT DOCUMENTS

| 5,404,375 | A | 4/1995 | Kroeger et al. |
| 5,854,702 | A | 12/1998 | Ishikawa et al. |
| 6,181,450 | B1 | 1/2001 | Dishman et al. |
| 6,271,953 | B1 | 8/2001 | Dishman et al. |
| 6,327,063 | B1 | 12/2001 | Rockwell |
| 6,567,574 | B1 | 5/2003 | Ma et al. |
| 6,792,028 | B2 | 9/2004 | Cook et al. |
| 7,304,296 | B2 | 12/2007 | Mills et al. |
| 7,593,641 | B2 | 9/2009 | Tegge, Jr. |
| 7,626,152 | B2 | 12/2009 | King et al. |

(Continued)

FOREIGN PATENT DOCUMENTS

WO    WO-2014200581 A2    12/2014

OTHER PUBLICATIONS

"U.S. Appl. No. 17/007,917, Notice of Allowance dated Jan. 10, 2022", 14 pgs.

(Continued)

*Primary Examiner* — Joseph P Martinez
*Assistant Examiner* — Grant A Gagnon
(74) *Attorney, Agent, or Firm* — Schwegman Lundberg & Woessner, P.A.

(57) ABSTRACT

An optical scanning system includes one or more Micro-Electro-Mechanical System (MEMS) Micro-Mirror Arrays (MMAs) used to scan a field-of-view (FOV) over a field-of-regard (FOR). The MEMS MMA is configured such that optical radiation from each point in the FOV does not land on or originate from out-of-phase mirror segments and a diffraction limited resolution of the optical system is limited by the size of the entrance pupil and not by the size of individual mirrors.

20 Claims, 10 Drawing Sheets

(56) References Cited

U.S. PATENT DOCUMENTS

| | | |
|---|---|---|
| 7,660,235 B2 | 2/2010 | Alicherry et al. |
| 7,667,190 B2 | 2/2010 | Mills et al. |
| 7,969,558 B2 | 6/2011 | Hall |
| 8,301,027 B2 | 10/2012 | Shaw et al. |
| 8,305,578 B1 | 11/2012 | Mudge et al. |
| 8,311,372 B2 | 11/2012 | Anderson et al. |
| 8,368,889 B2 | 2/2013 | Schwiegerling et al. |
| 8,380,025 B2 | 2/2013 | Anderson et al. |
| 8,463,080 B1 | 6/2013 | Anderson et al. |
| 8,767,190 B2 | 7/2014 | Hall |
| 8,823,848 B2 | 9/2014 | Chipman et al. |
| 8,983,293 B2 | 3/2015 | Frankel et al. |
| 9,473,768 B2 | 10/2016 | Uyeno et al. |
| 9,477,135 B1 | 10/2016 | Uyeno et al. |
| 9,632,166 B2 | 4/2017 | Trail et al. |
| 9,857,226 B2 | 1/2018 | LeMaster et al. |
| 9,904,081 B2 | 2/2018 | Uyeno et al. |
| 9,927,515 B2 | 3/2018 | Keller et al. |
| 10,148,056 B2 | 12/2018 | Uyeno et al. |
| 10,209,439 B2 | 2/2019 | Keller et al. |
| 10,243,654 B1 | 3/2019 | Uyeno et al. |
| 10,267,915 B2 | 4/2019 | Uyeno et al. |
| 10,381,701 B2 | 8/2019 | Motoi |
| 10,444,492 B2 | 10/2019 | Hopkins et al. |
| 10,718,491 B1 | 7/2020 | Raring et al. |
| 10,969,598 B2 | 4/2021 | Fest et al. |
| 10,998,965 B2 | 5/2021 | Tong et al. |
| 11,042,025 B2 | 6/2021 | Uyeno et al. |
| 11,333,879 B2 | 5/2022 | Uyeno et al. |
| 11,550,146 B2 | 1/2023 | Uyeno et al. |
| 2002/0141689 A1 | 10/2002 | Qian et al. |
| 2002/0196506 A1 | 12/2002 | Graves et al. |
| 2003/0062468 A1 | 4/2003 | Byren et al. |
| 2003/0081321 A1 | 5/2003 | Moon et al. |
| 2003/0185488 A1 | 10/2003 | Blumenthal |
| 2004/0072540 A1 | 4/2004 | Wilson et al. |
| 2004/0081466 A1 | 4/2004 | Walther et al. |
| 2004/0141752 A1 | 7/2004 | Shelton et al. |
| 2004/0258415 A1 | 12/2004 | Boone et al. |
| 2005/0031255 A1 | 2/2005 | Schroeder et al. |
| 2005/0100339 A1 | 5/2005 | Tegge |
| 2005/0122566 A1 | 6/2005 | Cicchiello |
| 2005/0288031 A1 | 12/2005 | Davis et al. |
| 2006/0038103 A1 | 2/2006 | Helmbrecht |
| 2007/0031157 A1 | 2/2007 | Yamada et al. |
| 2007/0036480 A1 | 2/2007 | Wu |
| 2008/0050064 A1 | 2/2008 | Sakai et al. |
| 2010/0149533 A1 | 6/2010 | Fest |
| 2010/0166430 A1 | 7/2010 | Alten |
| 2012/0002973 A1 | 1/2012 | Bruzzi et al. |
| 2012/0008133 A1 | 1/2012 | Silny et al. |
| 2012/0114337 A1 | 5/2012 | Aoki |
| 2012/0155885 A1 | 6/2012 | Hannah et al. |
| 2012/0168605 A1 | 7/2012 | Milanovic |
| 2013/0271818 A1 | 10/2013 | Bastien et al. |
| 2014/0063299 A1 | 3/2014 | Fest et al. |
| 2015/0099476 A1 | 4/2015 | Beals |
| 2015/0172218 A1 | 6/2015 | Beshai |
| 2015/0311981 A1 | 10/2015 | Inagaki et al. |
| 2015/0378242 A1 | 12/2015 | Auxier et al. |
| 2016/0003677 A1 | 1/2016 | Pezzaniti et al. |
| 2016/0043800 A1 | 2/2016 | Kingsbury et al. |
| 2016/0234703 A1 | 8/2016 | Aldana et al. |
| 2016/0294472 A1 | 10/2016 | Palmer et al. |
| 2017/0293137 A1 | 10/2017 | Zhao et al. |
| 2018/0231715 A1 | 8/2018 | Bishop et al. |
| 2019/0066320 A1 | 2/2019 | Uyeno et al. |
| 2019/0154921 A1 | 5/2019 | Xing et al. |
| 2020/0244359 A1 | 7/2020 | Csonka et al. |
| 2021/0088776 A1 | 3/2021 | Uyeno et al. |
| 2021/0091854 A1 | 3/2021 | Uyeno et al. |
| 2021/0092260 A1 | 3/2021 | Uyeno et al. |
| 2022/0229285 A1 | 7/2022 | Uyeno et al. |

OTHER PUBLICATIONS

"U.S. Appl. No. 17/007,917, Supplemental Notice of Allowability mailed Apr. 19, 2022", 2 pgs.
"U.S. Appl. No. 17/152,023, Notice of Allowance mailed Sep. 21, 2022", 9 pgs.
"U.S. Appl. No. 16/871,602, Non Final Office Action mailed Nov. 9, 2020", 18 pgs.
"U.S. Appl. No. 16/871,602, Notice of Allowance mailed Feb. 24, 2021", 5 pgs.
"U.S. Appl. No. 16/871,602, Response filed Feb. 8, 2021 to Non Final Office Action mailed Nov. 9, 2020", 12 pgs.
"U.S. Appl. No. 17/007,917, Non Final Office Action mailed Aug. 3, 2021", 35 pgs.
"U.S. Appl. No. 17/007,917, Response filed Dec. 1, 2021 to Non Final Office Action mailed Aug. 3, 2021", 16 pgs.
"High Contrast IR Wire Grid Polarizers", Edmund Optics, [Online]. Retrieved from the Internet: <URL: https://www.edmundoptics.com/f/high-contrast-ir-wire-grid-polarizers/14797/>, (Accessed Sep. 4, 2021), 1 pg.
"Mid-Wave Infrared (MWIR) and Long-Wave Infrared (LWIF) Waveplates", Edmund Optics, [Online]. Retrieved from the Internet: <URL: https://www.edmundoptics.com/f/mid-wave-infrared-mwir-and-long-wave-infrared-lwir-waveplates/14317/>, (Accessed Sep. 4, 2021), 2 pgs.
"Mirrorcle Technologies MEMS Mirrors—Technical Overview", Mirrorcle Technologies, Inc., (2018), 7 pgs.
Ayral, J.-L., et al., "Phase-conjugate Nd:YAG laser with internal acousto-optic beam steering", Optics Letters, vol. 16, No. 16, (Aug. 15, 1991), 1225-1227.
Chiu, Yi, et al., "Shape-Optimized Electrooptic Beam Scanners: Analysis, Design, and Simulation", Journal of Lightwave Technology, vol. 17, No. 1, (Jan. 1999), 108-114.
Kim, et al., "Demonstration of large-angle nonmechanical laser beam steering based on LC polymer polarization grating", Proc. of SPIE vol. 8052 80520T, (May 13, 2011).
Kim, Jihwan, et al., "Wide-angle, nonmechanical beam steering using thin liquid crystal polarization gratings", Proc. of SPIE, vol. 7093, (2008), 12 pgs.
Norton, Andrew, et al., "High-Power Visible-Laser Effect on a 37-Segment Iris AO Deformable Mirror", Proc. SPIE 7595, MEMS Adaptive Optics IV, 759506, (Feb. 17, 2010), 12 pgs.
Salmon, J.T., et al., "An Adaptive Optics System for Solid-State Laser Systems used in Inertial Confinement Fusion", First Annual International Conference on Solid-State Lasers for Application of Intertial Confinement Fusion, Monterey, California, May 30-Jun. 2, 1995, (Sep. 17, 1995), 13 pgs.
Wang, Jinxue, et al., "Doppler Winds Lidar Technology Development and Demonstration" AIAA-2005-6772, Space 2005, Long Beach, California, Aug. 30-1, 2005, 11 pgs.
Yamamoto, R., et al., "Evolution of a Solid State Laser", Proc. SPIE 6552, Laser Source Technology for Defense and Security III, 655205, (May 10, 2007), 11 pgs.
"MEMS Mirror Array—Beam Steering Mode", [Online]. Retrieved from the Internet: <www.youtube.com/watch?v=wHIUU3kKtzM>, (Aug. 10, 2017), 2 pgs.
Rodriguez, et al., "Beam steering by digital micro-mirror device for multi-beam and single-chip lidar", Proc. SPIE 10757, Optical Data Storage 2018: Industrial Optical Devices and Systems, (Sep. 14, 2018), 7 pgs.
Ryf, et al., "MEMS tip/tilt and piston mirror arrays as diffractive optical elements", Proc. SPIE 5894, Advanced Wavefront Control: Methods, Devices, and Applications III, (Aug. 30, 2005), 12 pgs.
Tsou, et al., "Extended-image spatial tracking technique for deep-space optical downlinks", Proc. SPIE 3762, Adaptive Optics Systems and Technology, (Sep. 27, 1999), 101-109.
Tuantranont, et al., "Optical beam steering using MEMS-controllable microlens array", Sensors and Actuators A: Physical vol. 91, Issue 3, (Jul. 15, 2001), 363-372.

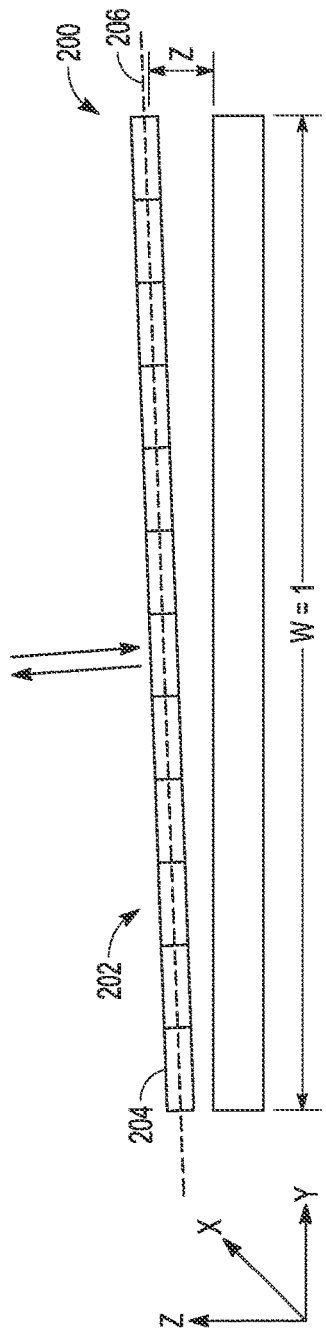
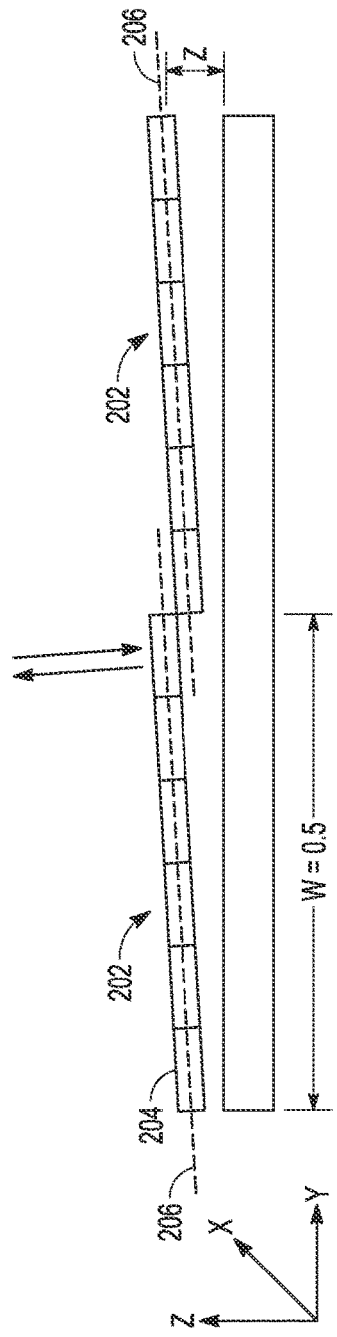
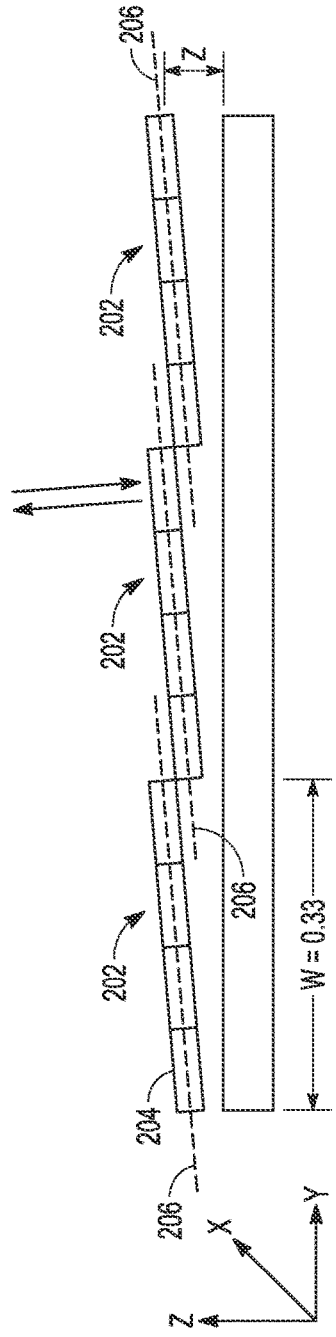

OPTICAL SCANNING SYSTEM USING MICRO-ELECTRO-MECHANICAL SYSTEM (MEMS) MICRO-MIRROR ARRAYS (MMAs)

BACKGROUND OF THE INVENTION

Field of the Invention

This invention relates to optical scanning systems for passive/active sensors and transmitters, and particularly to the use of a Micro-Electro-Mechanical System (MEMS) Micro-Mirror Array (MMA) to scan the optical system's field-of-view (FOV) over a field-of-regard (FOR). The optical scanning system may be used as part of guided munitions, autonomous vehicles, cameras or the like.

Description of the Related Art

Gimbaled optical sensors are commonly used as part of guided munitions and possibly autonomous vehicles. Passive systems use light emissions e.g. IR or visible from a target to detect and track the target. Active systems use an on-board source to emit light e.g. IR or visible, or RF that is reflected from the target to detect and track the target. The active return may be used for ranging, simple guidance commands to a target centroid or active imaging. The on-board source may also be used for other applications. The passive and active systems are often combined.

A typical gimbaled optical sensor includes inner (nod) and outer (roll) gimbals positioned behind a protective dome or window that rotate about orthogonal axes to point an optical axis in a three-dimensional space to scan a FOV over a FOR. An off-gimbal detector is responsive to a band of wavelengths e.g. Visible or IR (SWIR, MWIR, NIR, LWIR, etc.) A telescope mounted on the inner gimbal along the optical axis collects light from the target within the FOV to form an intermediate image. Gimbal optics propagate the light over the outer (roll) and inner (nod) gimbals along an optical path while preserving image quality. Off-gimbal focus optics relay the intermediate image to the detector. In some applications, an Aperture Sharing Element (ASE) is positioned in a receive aperture to separate the incident light into different wavelength bands e.g. Visible and IR and direct the light to different detectors. In a passive system, the pointer detects only emissions from the target within the FOV of the telescope. In a passive system, pointing control of a transmitter is performed "open loop", based only on the detection of the passive emissions of the target.

To add active capabilities, an off-gimbal optical source e.g., a laser, emits light in a narrowband around a specified wavelength. This transmit signal is routed along an optical path (free-space or fiber) along the gimbal axes to a transmit telescope where it is transmitted toward the target. The transmit telescope may be mounted off-axis from the receive telescope or a common Tx/Rx telescope may be used for both transmit (Tx) and receive (Rx). In the later case, an ASE may be positioned in a common aperture to couple the transmit signal from the optical source to the common Tx/Rx telescope and to couple the returned transmit signal and the passive emissions from the target to the detector. An additional ASE may be positioned in the receive path to separate the incident light into different wavelength bands and direct the light to different detectors. Processing of the active signal return again may provide for ranging, centroid guidance or active imaging. This allows for pointing control of a transmitter to be performed "closed loop" based on the desired and actual location of the laser spot on the target.

The aperture stop of an optical system is the aperture in the optical system that limits the diameter of the axial bundle of light that passes through the optical system from each point in the field of view. An entrance pupil is the image of the aperture stop as seen from object space. An exit pupil is the image of the aperture stop as seen from image space. The diffraction limited spot diameter refers to the smallest possible diameter that a distant point of light can be focused onto an image plane and determines the physical limit on the resolution that can be obtained in an imaging system. If the diameter of a focused point is large, the system will be low resolution. The diameter of the aperture stop (and its conjugates the entrance pupil and exit pupil) determines the best possible resolution that can be obtained from an imaging system (the diffraction limit). For imaging, the bundle of light from each point in the field of view passes through the entrance pupil (the image of the aperture stop in object space). If parts of the bundle of light are delayed and made out of phase to other parts of the bundle reaching the entrance pupil, then the diffraction limited resolution will not be determined by the size of the entrance pupil, but by the size of the largest segment of the axial bundle of light that is in-phase with itself.

For projecting light, the diffraction limit determines the smallest possible divergence of a collimated light source such as a laser. If parts of the bundle of light projecting out of the optical system are delayed and made out of phase (a large optical path difference) relative other parts of the bundle, the smallest possible divergence of the light source will be determined by the largest segment of the axial bundle of light that is in-phase with itself.

In certain applications, the optical sensor is positioned behind an optical window or dome, which may change the angle of each ray bundle associated with each point in the FOV and cause distortion in the image. Distortion may be mitigated by adding a corrector optical element.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides an optical scanning system in which one or more Micro-Electro-Mechanical System (MEMS) Micro-Mirror Arrays (MMAs) is used to scan a field-of-view (FOV) over a field-of-regard (FOR). The MEMS MMA is configured in different embodiments such that the diffraction limited resolution of the system is determined by the size of the entrance pupil.

The optical scanning system includes an optical system in which one or more optical elements are configured to propagate optical radiation focused at a near point at an active optical component (e.g. an optical detector and/or source) and collimated at a distant point within the FOV. Optical radiation at each point in the FOV passes through the entrance pupil. Each MEMS MMA is responsive to command signals to partition the MMA into one or more mirror segments, each mirror segment including one or more mirrors, and to at least tip and tilt the mirrors in at least 2 degrees-of-freedom (DOF) to approximate a continuous reflective surface in each mirror segment at a specified scan angle to scan the FOV over the FOR such that optical radiation from each point in the FOV does not land on or originate from out-of-phase mirror segments and the diffraction limited resolution of the optical system is limited by the size of the entrance pupil and not by the size of individual mirrors.

In an embodiment, the MEMS MMAs are arranged to address different portions of the FOR. Only one of MEMS MMA is active to scan the FOV over its portion of the FOR. A fold mirror selects the active MEMS MMA to propagate optical radiation between the active optical component and the active MEMS MMA. The fold mirror may be a conventional gimbaled mirror another secondary MEMS MMA in which the mirrors are responsive to command signals to at least tip and tilt to select the active MEMS MMA. The fold mirror is similarly configured such that the system's diffraction limited resolution is limited by the size of the entrance pupil.

In an embodiment, the mirrors tip, tilt and piston in 3 DOF to scan the FOV over the FOR. In one case, the MEMS MMA is partitioned into a single mirror segment including all of the mirrors. The mirrors are tipped, tilted and pistoned to approximate a single continuous reflective surface at the specified scan angle. This case will require either a limited scan angle or a large dynamic range to piston (translate) the mirrors. In another case, the MEMS MMA is partitioned into a minimum number of mirror segments each having a maximum size as limited by a maximum translation z to approximate the continuous reflective surface at the specified scan angle. This case optimizes the size of the mirror segments based on the available maximum translation z and the specified scan angle. For larger scan angles, the size of the mirror segments may limit the systems diffraction limited resolution. In a third case, if the optical radiation is coherent at a specified wavelength, the MEMS MMA is configured using piston such that the optical path differences between mirror segments are a multiple of 2pi times the wavelength to maintain phase matching across the wavefront. This may be combined with the previous case to maximize the size of the mirror segments in order to minimize the number of discontinuities between mirror segments.

In another embodiment, the optical scanning system is configured such that the size of the entrance pupil is less than the size of one mirror segment. In this case, optical radiation from the entrance pupil passes across a single mirror segment and thus the diffraction limited resolution is limited by the size of the entrance pupil and not the size of a given mirror segment. If piston is available, multiple mirrors can be configured to approximate the continuous reflective surface thereby increasing the size of the mirror segment. The size of the entrance pupil may be designed so that it is less than the size of the smallest mirror segment required for the maximum scan angle. Light collection may be limited in this configuration.

In another embodiment, the MEMS MMA is positioned at or near an intermediate image plane of the optical system e.g., where optical radiation comes to an intermediate focus or is within the depth of focus of the intermediate focus. As optical radiation from the entrance pupil does not pass across multiple small out-of-phase mirror segments, the optical system performance is diffraction limited by the size of the entrance pupil and not the mirror segments. Any optical elements upstream of the MEMS MMA will have to be sized to accommodate scanning the FOV over the FOR.

In another embodiment, if piston is available, the mirrors may be translated to adjust for path length differences across a wavefront of the optical radiation such as may be induced by a window or dome. This can be implemented within a given mirror segment (comprising multiple mirrors) or between mirror segments and can be used to augment any of the above cases.

In another embodiment, the MEMS MMAs may be configured to approximate a base curvature that provides optical power, alone or in combination with other optical elements, to focus or collimate the optical radiation. This base curvature may be provided by tipping, tilting and pistoning the mirrors. Alternately, a plurality of flat MEMS MMAs may be mounted on flat facets of a support structure in which in combination the facets, hence the MEMS MMA approximate in a piecewise linear fashion the base curvature. Piston may be used to smooth the piecewise linear approximate, requiring less piston to do this than to provide the entire base curvature. In another embodiment, one or more flexible or curved MEMS MMAs may be mounted on a support structure that provides the base curvature.

These and other features and advantages of the invention will be apparent to those skilled in the art from the following detailed description of preferred embodiments, taken together with the accompanying drawings, in which:

BRIEF DESCRIPTION OF THE DRAWINGS

FIG. 1 is a side view of an embodiment of an optical scanning system in a guided munition in which a single MEMS MMA is used to scan the FOV over a FOR;

FIG. 4 is an illustration of a MEMS MMA configured to tip, tilt and piston mirrors at a specified scan angle to approximate a single continuous reflective surface to re-direct the FOV;

FIGS. 5A and 5B are illustrations of a MEMS MMA that is partitioned into a minimum number N of mirror segments to provide a specified scan angle and configured via tip, tilt and piston to approximate a continuous reflective surface at, the specified scan angle for each mirror segment;

FIGS. 10A and 10B are on-axis and side views of an embodiment of an optical scanning system in a guided munition in which a plurality of MEMS MMAs and a fold mirror are used to scan the FOV over a FOR.

DETAILED DESCRIPTION OF THE INVENTION

Figure 1:
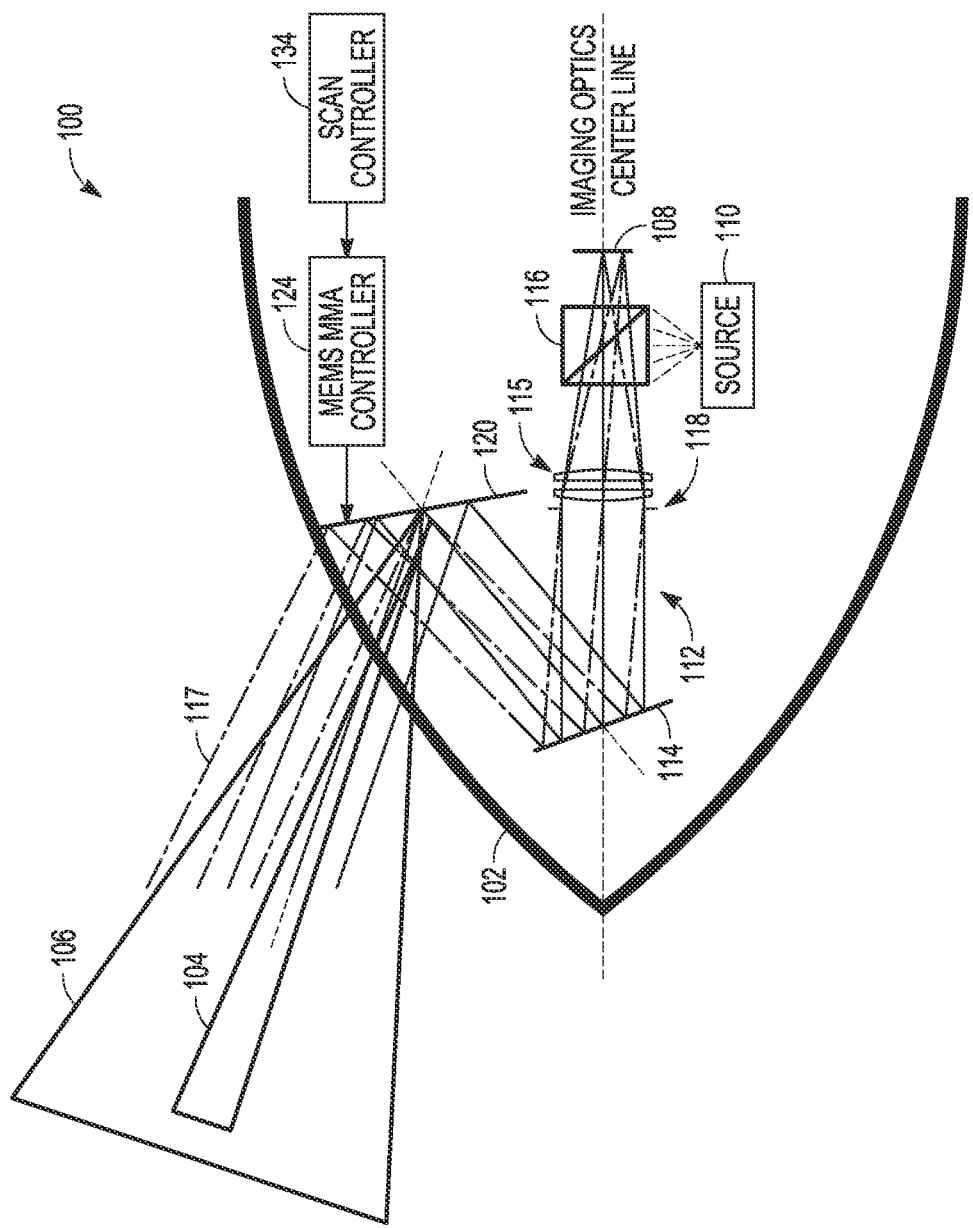

The present invention provides an optical scanning system in which one or more Micro-Electro-Mechanical System (MEMS) Micro-Mirror Arrays (MMAs) is used to scan a field-of-view (FOV) over a field-of-regard (FOR). The MEMS MMA can provide SWaP-C (size, weight, power and cost) and other advantages such as scanning speed over conventional optical scanning systems. The MEMS MMA is configured in different embodiments such that the diffraction limited resolution of the system is determined by the size of the entrance pupil and not by the size of individual mirrors.

The optical scanning system may be configured as a sensor, active and/or passive, and/or a transmitter. The scanning system includes an optical system of one or more optical elements (transmissive or reflective) configured to propagate optical radiation focused at a near point at an active optical component (detector or source) and collimated toward a distant conjugate point within the FOV. Optical radiation at each point in the FOV passes through an entrance pupil. The optical system may have any number of different configurations that take collimated light in the far field and focus it onto the detector or take diverging light from the source and project collimated light. In terms of optical design, light is reversible i.e., an optical system that works to focus light from a distant point within a FOV to a near point can also work in reverse. Diverging light at a near point can propagate through the optical system and collimated toward a distant conjugate point. The optical scanning system can be designed across the optical spectrum including the visible, infrared (IR) and ultraviolet (UV) bands. Some embodiments are applicable to either coherent or inherent optical radiation whereas others are limited to coherent optical radiation at a specific wavelength.

The one or more MEMS MMAs are configured to scan the FOV formed by the optical system over a FOR. The MEMS MMAs and optical system are configured in such a manner that the system's diffraction limited resolution is determined by the size of the entrance pupil and not the size of an individual mirror. The MEMS MMA may also be used to compensate for distortions to the wavefront induced by, for example, an optical window or dome. The one or more MEMS MMAs may also be configured to provide a portion of the optical power required to focus/collimate the optical radiation.

Referring now to FIGS. 1, 2A-2B and 3, in an embodiment an optical scanning system 100 is positioned behind an optical dome 102 of a guided munition to scan a FOV 104 within a larger FOR 106 to receive or transmit optical radiation. Optical scanning system 100 includes both an optical detector 108 (e.g., a focal plane array (FPA) and a Read Out Integrated Circuit (ROIC)) and an optical source 110 (e.g. a coherent or incoherent laser). An optical system 112 includes one or more optical elements 114 and 115 e.g. lenses or mirrors configured to propagate optical radiation focused at a near point at the active optical component e.g., optical detector 108 and optical source 110 via a beam splitter 116 and collimated toward a distant conjugate point within the FOV 104. In this simplified configuration, the optical system includes a folding mirror 114 and a powered lens 115. Optical radiation 117 at each point in the FOV passes through an entrance pupil 118.

One or more MEMS MMAs 120, each comprising a plurality of independently controllable mirrors 122, are positioned in the optical path. Each MEMS MMA 120 is responsive to command signals from a MEMS MMA controller 124 to partition the MMA into one or more mirror segments 126, each mirror segment including one or more mirrors 122, and to at least tip 128 and tilt 130 the mirrors in at least 2 degrees-of-freedom (DOF) to approximate a continuous reflective surface 132 in each mirror segment at a specified scan angle provided by a scan controller 134 to scan the FOV 104 over the FOR 106. The MEMS MMA may be configured to tip 128, tilt 130 and piston 136 (translate in the z-direction) in 3 DOF. Each mirror is capable of at least "Tip" (rotation about an X-axis), "Tilt" (rotation about a Y-axis and "Piston" (translation along a Z-axis, perpendicular to the XY plane) where the X, Y and Z are orthogonal axes in a three-dimensional space.

In an embodiment, the MEMS MMA is preferably capable of tipping and tilting over range of at least −15°×+15° to steer over a range of +/−30°×30° and pistoning (translating) over a range of at least +/−15 microns (at least one-half wavelength in either direction) piston at a rate of at least 1 Hz (<1 millisecond). Further, the MEMS MMA must have a sufficient number of mirrors, mirror size/resolution, fill factor, range of motion, response time, response accuracy and uniformity across the array.

Figure 2A:
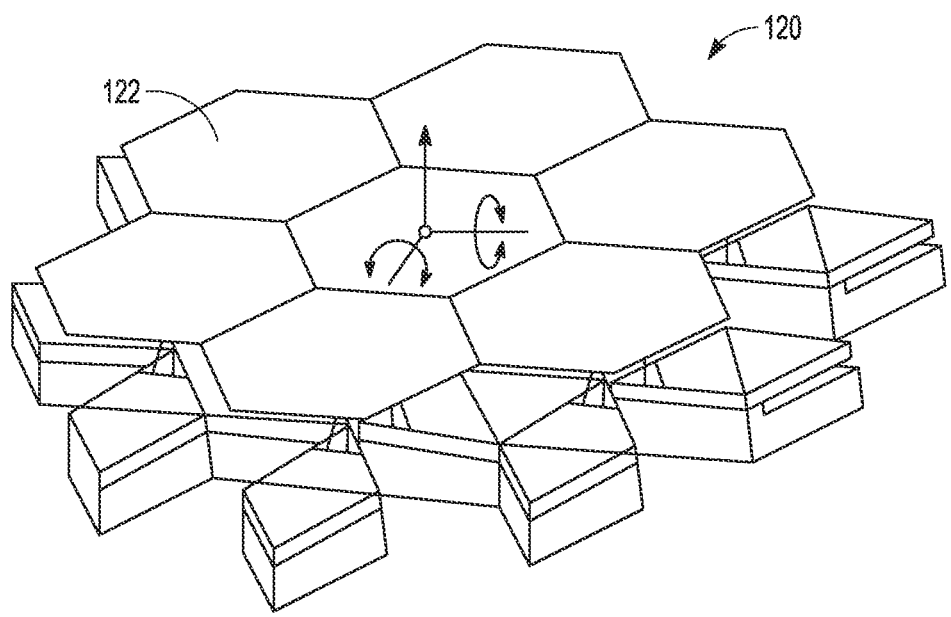
FIGS. 2A-2B are illustrations of a known embodiment of a Tip/Tilt/Piston ("TIP") MEMS MMA and a single mirror actuated to tip, tilt and piston.
Figure 2B:
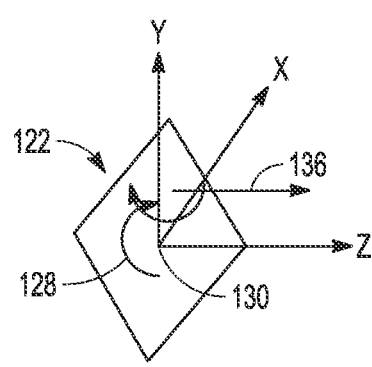
Figure 3:
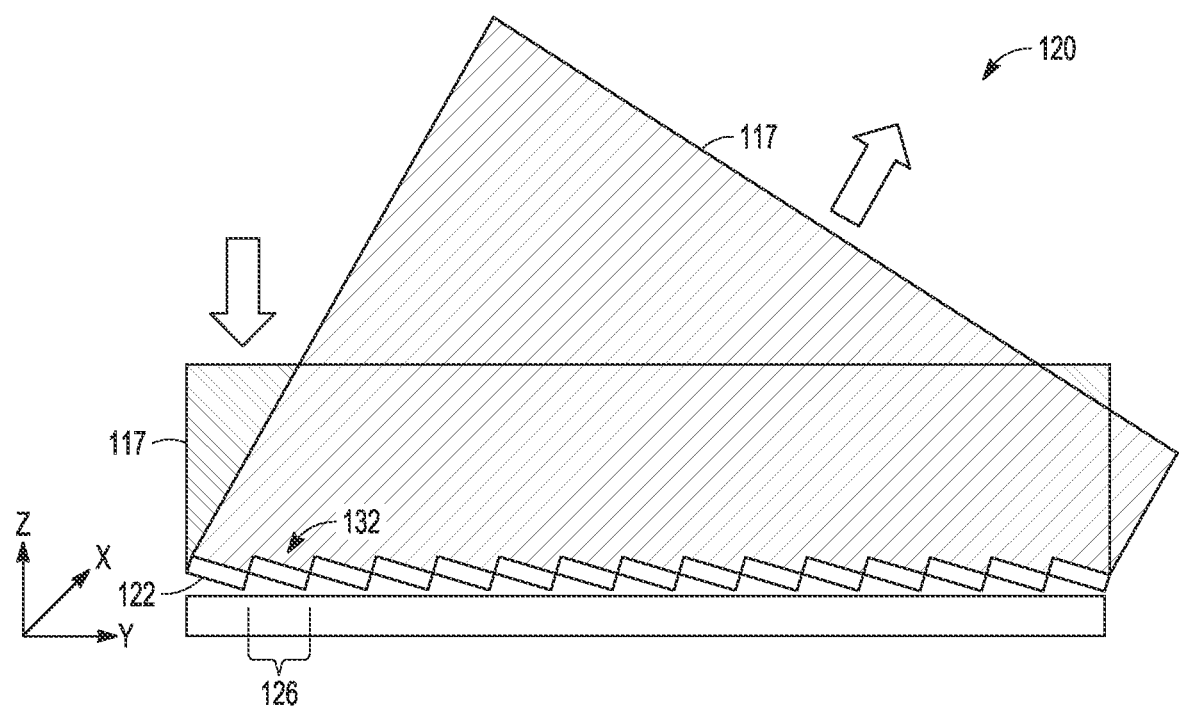
FIG. 3 is an illustration of a MEMS MMA configured to tip and tilt each mirror at a specified scan angle to re-direct the FOV.

One such MEMS MMA as illustrated in FIGS. 2A-2B is described in U.S. Pat. No. 10,444,492 entitled "Flexure-Based, Tip-Tilt-Piston Actuation Micro-Array", which is hereby incorporated by reference. As shown in FIGS. 1-3 of the '492 patent this MEMS MMA uses flexures to support each mirror at three fulcrum points (or vertices) of an equilateral triangle. The three different pairs of fulcrum points define three axes at 60 degrees to one another in the XY plane. Each mirror pivots about each axis to produce tip, tilt and piston in the XYZ space. This MEMS MMA is currently being commercialized by Bright Silicon technologies for "digitally controlling light."

If optical radiation 117 from a ray bundle is reflected off of the individual mirrors 122 of the MEMS MMA 120, the optical path differences across the mirrors can make portions of the ray bundle out-of-phase. This can degrade the imagery provided to optical detector 108. For transmission, if the optical radiation from optical source 110 is re-directed from the individual mirrors 122, the beam may diverge according to the limit imposed by an individual mirror rather than the entire surface of the MMA. In other words, the system's diffraction limited resolution is no longer determined by the size of the entrance pupil but rather by the size of an individual mirror. This degradation of the sensed imagery or projected beam is the apparent trade-off to the SWaP-C and scan rate advantages of using a MEMS MMA to scan the FOV over the FOR.

The present invention configures the MEMS MMA and optical system to overcome this apparent limitation such that optical radiation from each point in the FOV does not land on or originate from out-of-phase mirror segments and a diffraction limited resolution of the optical system is limited by the size of the entrance pupil and not by the size of the mirror segments. This preserves either the detected image quality or projected beam quality.

As will be described below, there are multiple different configurations of the MEMS MMA that provide the SWaP-C and scan rate advantages while preserving the system's diffraction limited resolution. Each has advantages and constraints. In a first case, the MEMS MMA is responsive to command signals to partition itself into a single mirror segment including all of the mirrors, which are tipped, tilted and pistoned to approximate a single continuous reflective surface at the specified scan angle to emulate a conventional gimbaled mirror. The constraint is limited scan angle for a maximum translation z of each mirror. In a second case, the MEMS MMA is responsive to command signals to adaptively partition itself into a minimum number of mirror segments for a specified scan angle. The larger the scan angle, the smaller the mirror segment that can be supported and the larger the number of mirrors. At large scan angles, the mirror segment may be small enough that the system's diffraction limited resolution is somewhat degraded. In a third case, limited to coherent optical radiation, piston of each mirror segment is controlled such that the optical path differences between the mirror segments are a multiple of 2*pi times the specified wavelength of the coherent optical radiation to maintain phase matching across a wavefront of the coherent optical radiation. In a fourth case, the system's entrance pupil and MEMS MMA's mirrors are sized such that the size of the entrance pupil is less than the size of one mirror segment. This may be combined with the second case to maximize the size of the mirror segments for a specified scan angle. In this case the amount of light collected may be limited. In a fifth case, the MEMS MMA is positioned at or near an intermediate image plane (or focus) in the optical system. The tradeoff is that any optical components upstream of the MEMS MMA will have to be sized to account for the scanning of the FOV.

If piston is available, the mirrors may be translated to adjust for path length differences across a wavefront of the optical radiation such as may be induced by a window or dome. This can be implemented within a given mirror segment (comprising multiple mirrors) or between mirror segments and can be used to augment any of the above cases.

In another embodiment, the MEMS MMAs may be configured to provide a base curvature that provides optical power, alone or in combination with other optical elements, to focus or collimate the optical radiation. This base curvature may be provided by tipping, tilting and pistoning the mirrors. Alternately, a plurality of flat MEMS MMAs may be mounted on flat facets of a support structure in which in combination the facets, hence the MEMS MMA approximate in a piecewise linear fashion the base curvature. Piston may be used to smooth the piecewise linear approximate, requiring less piston to do this than to provide the entire base curvature. In another embodiment, one or more flexible or curved MEMS MMAs may be mounted on a support structure that provides the base curvature.

configuration is limited by the maximum piston stroke z. This approach is viable for either coherent or incoherent optical radiation.

As shown in FIGS. 4 and 5A-5B, in case 2 a MEMS MMA 200 is adaptively partitioned (based on the current scan angle) into one or more mirror segments 202 with each section including a plurality of mirrors 204 exhibiting tip, tilt and piston capabilities. To provide a specified steering angle, all of the mirrors within a segment and all of the mirrors between different segments are tipped and tilted about the X and Y axes, respectively, at the same tip and tilt angles. Each mirror within a segment is pistoned (translated along the Z axis) by a requisite amount such that the mirrors approximate a continuous reflective surface 206 across the segment. The maximum angle, tip or tilt, that can be achieved is given by arcsin(z/w) where z is the maximum piston stroke (translation along z) and w is the width of the section (e.g. for tip, the number of mirrors and width of each mirror along the Y axis). For larger values of w (more mirrors grouped into a section), the maximum tilt angle, hence steering angle is smaller. Therefore, for small steering angles the number of mirror segments N is small and the size of the mirror segment is large. This adaptive approach will satisfy the system's diffraction limited resolution constraint for small scan angles. For larger scan angles some degradation may occur. An additional benefit of this optimization is that the number of edge discontinuities between mirror segments is minimized, which minimizes diffraction. This approach is viable for either coherent or incoherent optical radiation.

Table 1 is a plot of mirror tip angle for which a continuous reflective surface across a mirror segment can be formed versus the number of mirror segments (grouping of mirrors) along an axis of the MEMS MMA. In this example, the MEMS MMA includes 20 mirrors (1 mm in width) positioned along the Y axis to tip about the X axis. Each mirror can tip and tilt +/−15° about the X and Y axes, respectively, and piston +/−35 microns along the Z axes.

TABLE 1

| w | Section width | 20 | 10 | 5 | 4 | 2 | 1 |
|---|---|---|---|---|---|---|---|
| N | # Sections | 1 | 2 | 4 | 5 | 10 | 20 |
| z | Max Piston (mm) | 0.07 | 0.07 | 0.07 | 0.07 | 0.07 | 0.07 |
| Tip | Arcsin(z/w) (deg) | 0.201 | 0.401 | 0.802 | 1.003 | 2.006 | 4.014 |
|  | Diffraction spot size (deg) | 0.003 | 0.007 | 0.014 | 0.917 | 0.0035 | 0.0070 |

As shown in FIG. 4, in Case 1 a MEMS MMA 200 is partitioned into a single mirror segment 202 including all of the mirrors 204 exhibiting tip, tilt and piston capabilities. To provide a specified steering angle, all of the mirrors within the single mirror segment 202 are tipped and tilted about the X and Y axes, respectively, at the same tip and tilt angles. Each mirror within the single mirror segment 202 is pistoned (translated along the Z axis) by a requisite amount such that the mirrors approximate a single continuous reflective surface 206 across the single mirror segment. The maximum angle, tip or tilt, that can be achieved is given by arcsin(z/w) where z is the maximum piston stroke (translation along z) and w is the width of the mirror segment (e.g. for tip, the number of mirrors and width of each mirror along the Y axis). The range of scan angles that can be serviced by this As expected, as the mirror segment width increases to preserve diffraction limited resolution, the maximum tip decreases. Note, the diffraction spot size also decreases indicating less diffraction due to fewer edge discontinuities. For this specific MEMS MMA configuration e.g. number of mirrors, size of the mirror, max piston etc. the serviceable angular range to gain benefits from approximating a continuous reflective surface across multiple mirrors that form a section is quite small, 2 degrees or less. Although shown in Table 1 the entry for a section including only a single mirror is a degenerate case. For a single mirror, the limiting factor is the maximum tip (or tilt) angle of the mirror itself. In this example, that is 15 degrees, not 4 degrees as suggested by the geometry. As such, in this example, which is exemplary of typical MMA configurations, considerable scan angle range may be sacrificed in order to preserve the system's diffraction limited resolution (and reduce diffraction).

In light of this, configuring the MEMS MMA to approximate continuous reflective surfaces may not be practical for many typical applications in which a large range of scan angles is required. This approach may be limited to applications such as the long range steering as found in space-based systems or to compensate for small angular adjustments such as found on imaging platforms to compensate for vibration. A hybrid approach in which the MEMS MMA is configured as shown in FIG. 3 i.e. 1 mirror per mirror segment to service large scan angles and is configured as shown in FIGS. 4 and 5A-5B i.e. multiple mirrors per segment to service small scan angles may be viable, particularly where large angle scanning is relatively infrequent.

Figure 6:
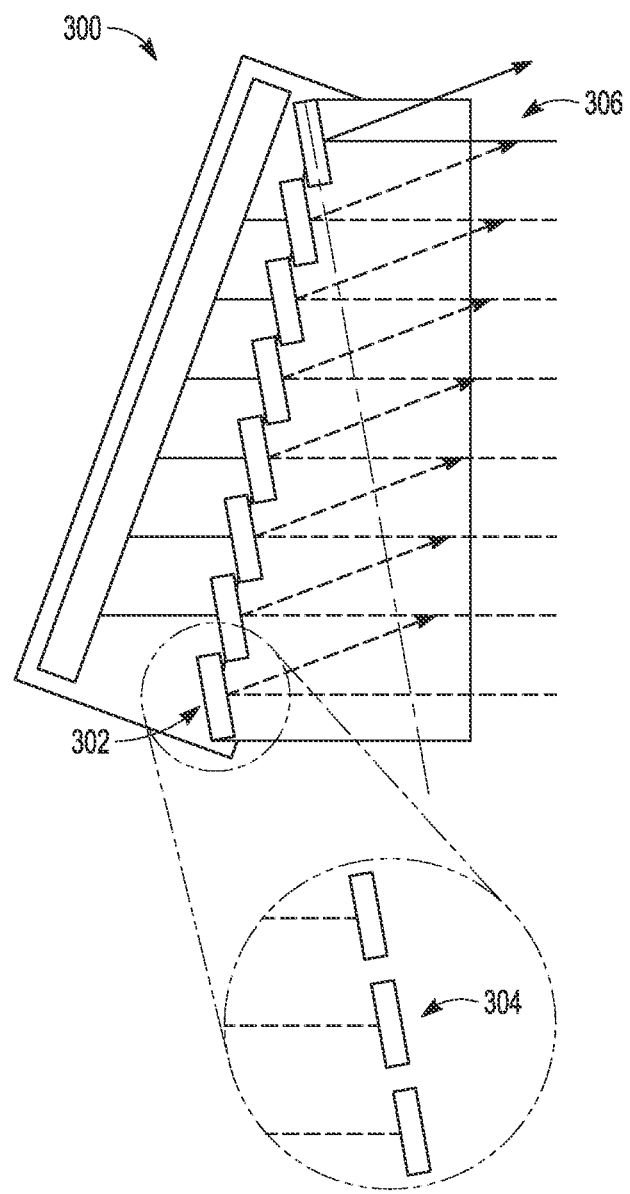
FIG. 6 is an illustration of a MEMS MMA configured to tip, tilt and piston each mirror segment such that all of the mirror segments are in-phase for coherent optical radiation.

As shown in FIG. 6, in case 3, a MEMS MMA 300 is partitioned into a plurality of mirror segments 302 each including one or more mirrors 304. A ray bundle of coherent optical radiation 306 at a specified wavelength passes across multiple MMA segments or "sub-apertures". The optical path differences across the mirror segments can make portions of the ray bundle out-of-phase. Optical radiation from each distant point in the FOV forms a "footprint" on the MEMS MMA. Different "footprints" are overlapping each other on the MEMS MMA. This would appear as a plurality of out-of-phase sub-apertures that would degrade image (or beam) quality. To compensate for this, the MEMS MMA 300 responsive to command signals pistons each of a plurality of mirror segments 302 such that the optical path differences between the mirror segments are a multiple of 2*pi times the specified wavelength to maintain phase matching across the ray bundle (or wavefront) of the coherent optical radiation. The multiple can be as large as necessary such that the requisite piston (or translation) of each mirror to both approximate the continuous reflective surface within a mirror segment and to maintain phase matching between mirror segments is serviceable by the maximum translation z of a given mirror. Case 3 may be augmented with the case 3 optimized grouping to form the largest mirror segments that can provide a given scan angle to further reduce diffraction.

Figure 7:
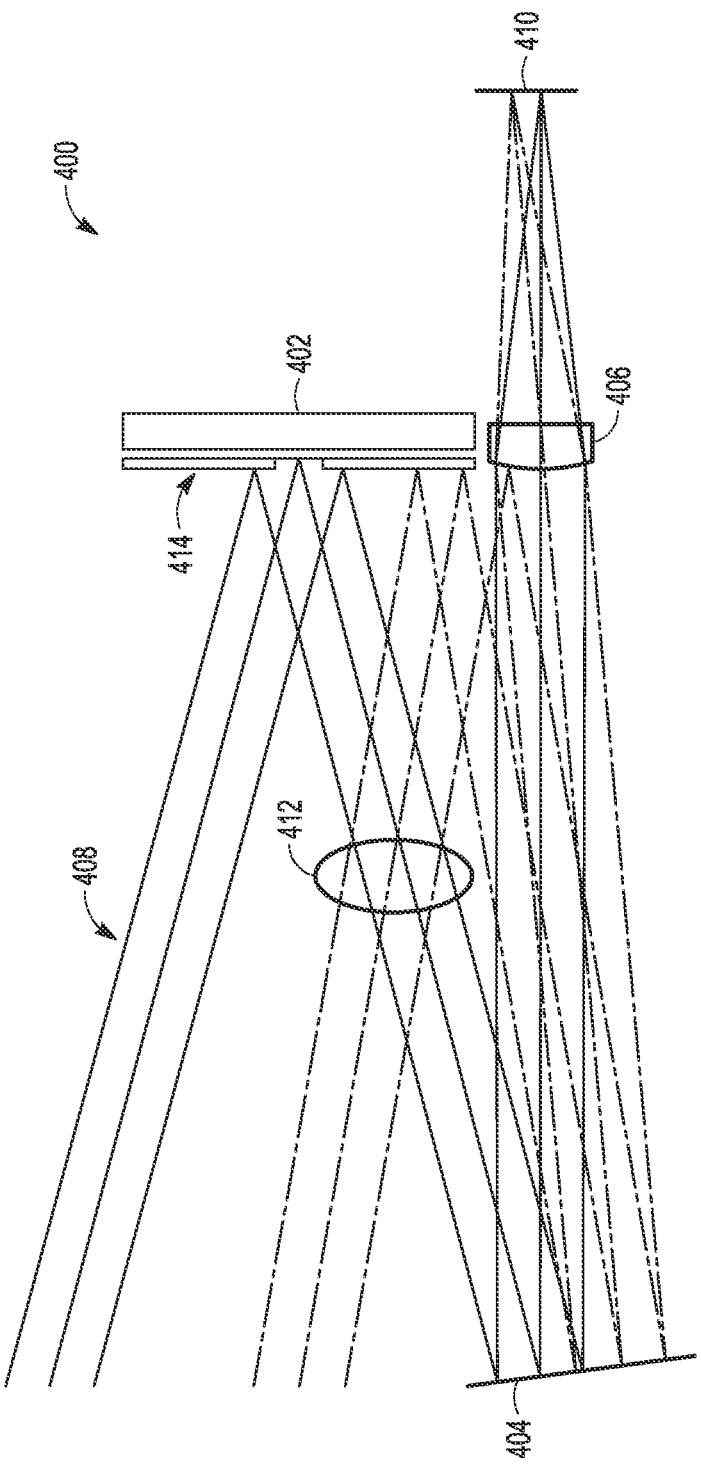
FIG. 7 is an illustration of an optical scanning system in which the entrance pupil diameter is less than or approximately equal to the diameter of a mirror segment of the MEMS MMA.

As shown in FIG. 7, in case 4, an optical scanning system 400 includes a MEMS MMA 402 that forms a Primary mirror, a fold mirror 404 and a focusing lens 406 configured to propagate optical radiation 408 collimated at a distant point within a field-of-view (FOV) and focus the optical radiation at a near point at an optical detector 410. Optical radiation at each point in the FOV passes through an entrance pupil 412. The optical system and MEMS MMA are configured such that the size of entrance pupil 412 is less than the size of one mirror segment 414 including one or more mirrors. The same principle is applicable for scanning of an optical beam. This approach is viable for either coherent or incoherent optical radiation.

In this case, optical radiation from the entrance pupil 412 passes across a single mirror segment and thus the diffraction limited resolution is limited by the size of the entrance pupil and not the size of a given mirror segment. If piston is available, multiple mirrors can be configured to approximate the continuous reflective surface thereby increasing the size of the mirror segment. The size of the entrance pupil may be designed so that it is less than the size of the smallest mirror segment required for the maximum scan angle. Light collection may be limited in this configuration.

Figure 8:
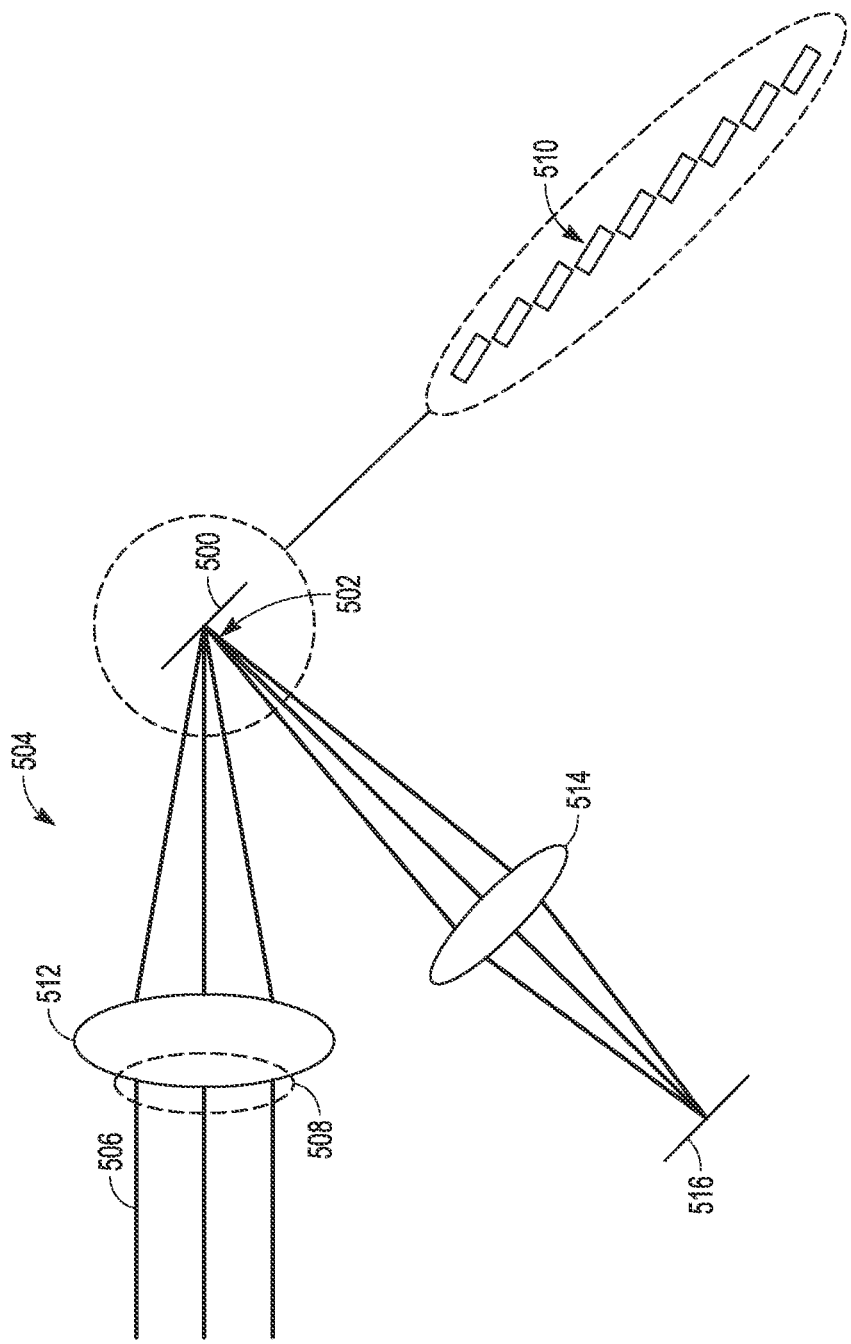
FIG. 8 is an illustration of an optical scanning system in which a MEMS MMA is positioned at or near an intermediate image plane to scan the FOV.

As shown in FIG. 8, in case 5 a MEMS MMA 500 is positioned at or near an intermediate image plane (focus) 502 of an optical scanning system 504 where near is defined as being within the intermediate image depth of focus. As optical radiation 506 (coherent or incoherent) from an entrance pupil 508 does not pass across multiple small out-of-phase mirror segments 510, the optical system performance is diffraction limited by the size of the entrance pupil and not the mirror segments 510. Any optical elements such as lens 512 upstream of the MEMS MMA 500 will have to be sized to accommodate scanning the FOV over the FOR. Any downstream optical elements such as lens 514 and optical detector 516 are unaffected. The same principle is applicable for scanning of an optical beam.

Figure 9A:
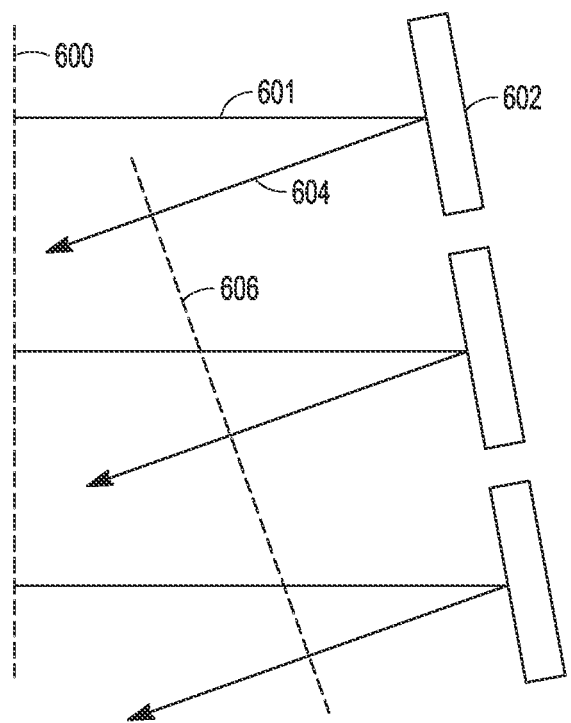
FIGS. 9A-9C are illustrations of superimposing additional piston to compensate for distortions of the wavefront.
Figure 9B:
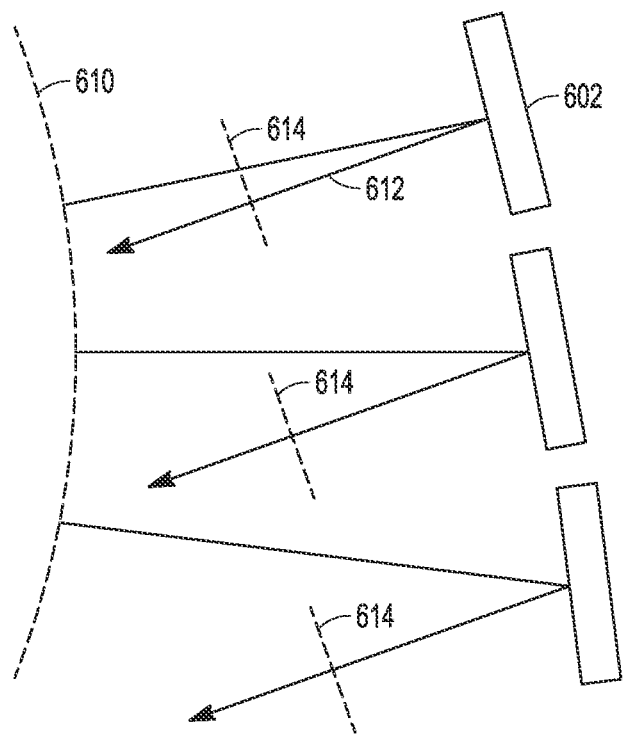
Figure 9C:
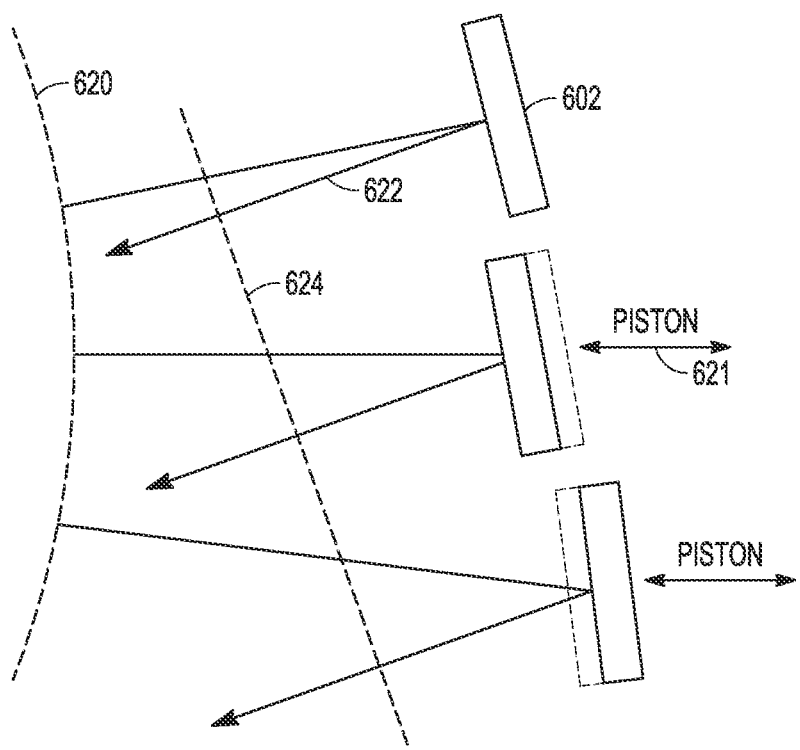

As previously mentioned, in certain applications the optical radiation must pass through an optical window or dome, which may change the angle of each ray bundle associated with each point in the FOV and cause distortion in the image. As shown in FIGS. 9A-9C, if available, piston may be used in any of the cases described to maintain phase across the wavefront of the optical radiation to eliminate or mitigate any distortion induced by the window or dome. As shown in FIG. 9A, sans a window or dome, a wavefront 600 of collimated rays 601 of optical radiation is flat, exhibiting constant phase. The mirror segments 602 are tipped and tilted at a specified scan angle to re-direct a reflected ray 604 of optical radiation and maintain the constant phase across the re-directed wavefront 606. As shown in FIG. 9B, optical radiation that passes through a window or dome has a curved wavefront 610. Simply tipping and tilting the mirror segments in the same manner controls the scan angle of the reflected ray 612 but the path length is now different across each reflected ray and a distorted wavefront 614 is now flat but out-of-phase. As shown in FIG. 9C, given a distorted wavefront 620, additional piston 612 can be applied to mirror segments 602 so that constant path length is maintained across the mirror segments and reflected rays 622 and a corrected wavefront 644 is in-phase.

Figure 10A:
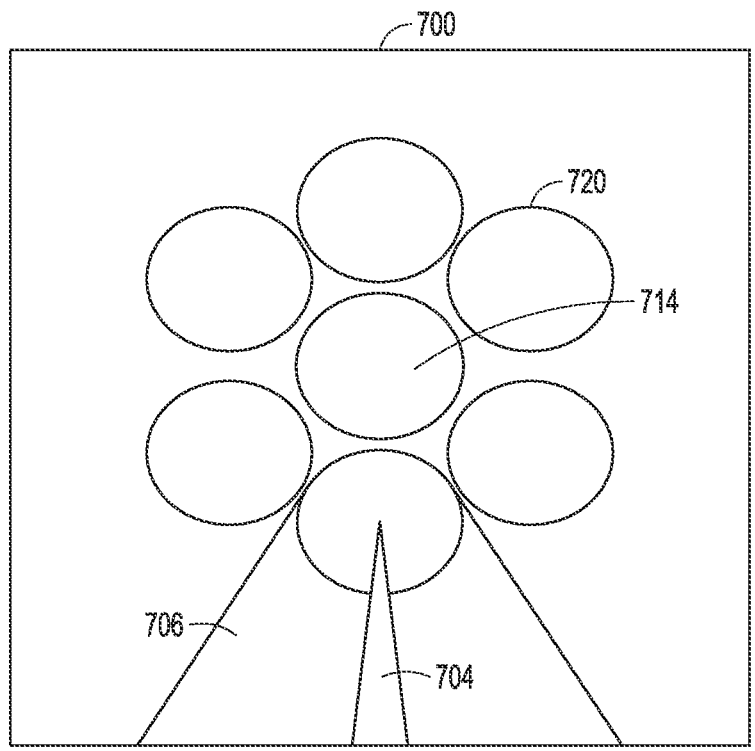
Figure 10B:
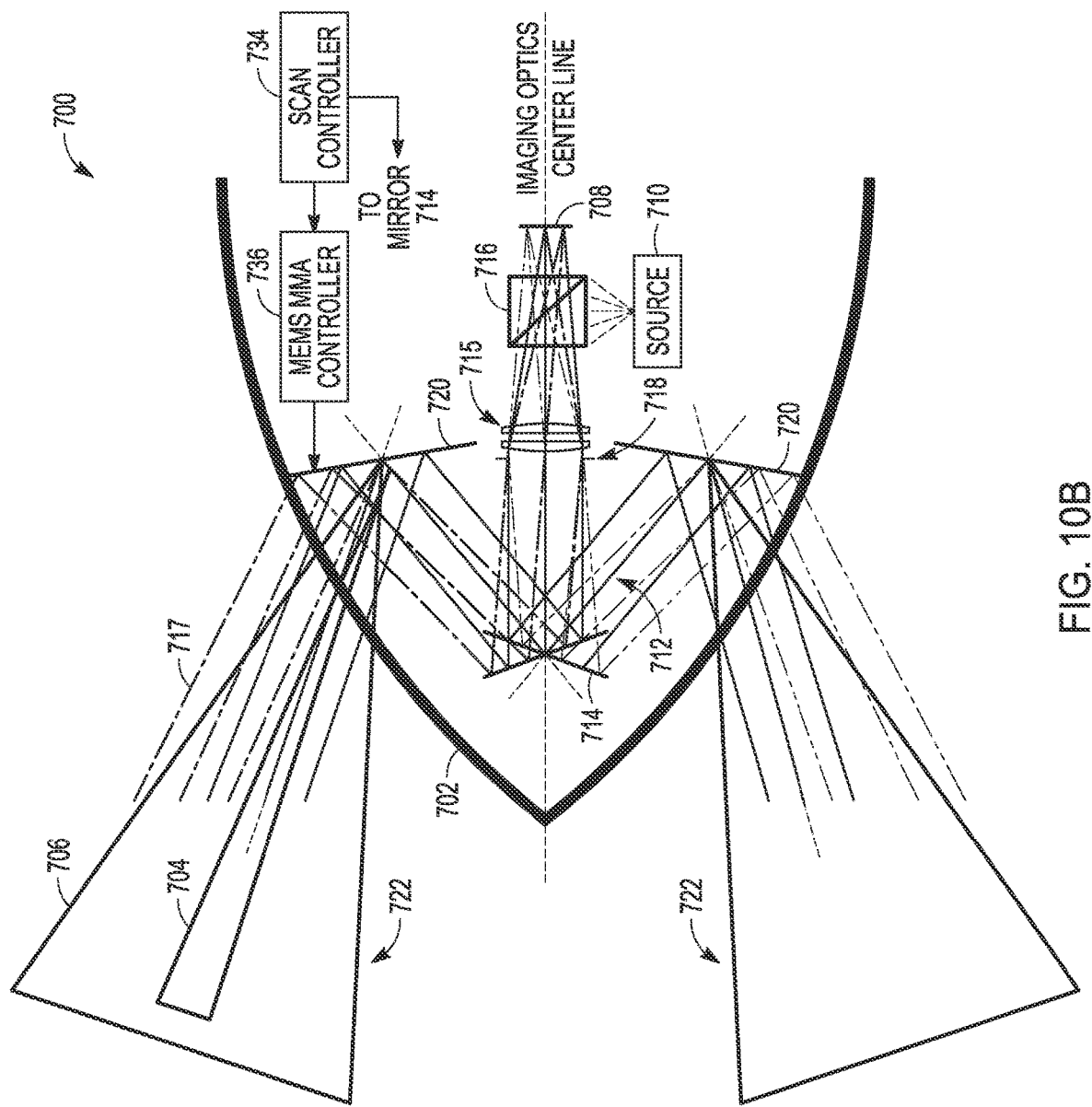

Referring now to FIGS. 10A and 10B, in an embodiment an optical scanning system 700 is positioned behind an optical dome 702 of a guided munition to scan a FOV 704 within a larger FOR 706 to receive or transmit optical radiation. Optical scanning system 700 includes both an optical detector 708 (e.g., a focal plane array (FPA) and a Read Out Integrated Circuit (ROIC)) and an optical source 710 (e.g. a coherent or incoherent laser). An optical system 712 includes one or more optical elements 714 and 715 e.g. lenses or mirrors configured to propagate optical radiation focused at a near point at the active optical component e.g., optical detector 708 and optical source 710 via a beam splitter 716 and collimated toward a distant conjugate point within the FOV 704. In this simplified configuration, the optical system includes a steerable folding mirror 714 and a powered lens 715. Optical radiation 717 at each point in the FOV passes through an entrance pupil 718.

A plurality (e.g., six) of MEMS MMAs 720 are arranged to address different portions (FOR 706) of a combined field-of-regard (FOR) 722, Steerable fold mirror 714 is responsive to command signals from a scan controller 734 to direct optical radiation between the active optical component, detector 708 or source 710, and one active MEMS MMA 720 at a time. The active MEMS MMA is responsive to command signals from a MEMS MMA controller 736 to partition the MMA into one or more mirror segments, each mirror segment including one or more mirrors, and to at least tip and tilt the mirrors to approximate a continuous reflective surface in each mirror segment at a specified scan angle provided by scan controller 734 to scan the FOV 704 over its portion 706 of the combined FOR 722. The MEMS MMAs 720 may be configured using any of the aforementioned cases such that optical radiation from each point in the FOV does not land on or originate from out-of-phase mirror segments and a diffraction limited resolution of the optical system is limited by the size of the entrance pupil and not by the size of individual mirrors.

The steerable fold mirror 714 may be a conventional gimbaled mirror or another secondary MEMS MMA in which the mirrors are responsive to command signals to at least tip and tilt to select the active MEMS MMA. The steerable fold mirror is similarly configured such that the system's diffraction limited resolution is limited by the size of the entrance pupil. The primary MEMS MMAs and the secondary MEMS MMA may implement the same or different cases to maintain the system's diffraction limited resolution. For example, the primary MEMS MMAs could implement Case 3 whereby the different mirror segments are pistoned to maintain a path length difference of a multiple of 2pi times the wavelength of coherent light to maintain phase coherence across the wavefront while the secondary MEMS MMA could be positioned at an intermediate image plane in accordance with Case 5.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. An optical scanning system, comprising:
   an active optical component including an optical detector or source;
   an optical system including one or more optical elements configured to propagate optical radiation focused at a near point at the active optical component and collimated toward a distant conjugate point within a field-of-view (FOV), wherein optical radiation at each point in the FOV passes through an entrance pupil; and
   one or more Micro-Electro-Mechanical System (MEMS) Micro-Mirror Arrays (MMAs) each comprising a plurality of mirrors, each said MEMS MMA responsive to command signals to partition the MMA into one or more mirror segments, each mirror segment including one or more mirrors, and to at least tip and tilt the mirrors in at least 2 degrees-of-freedom (DOF) to approximate a continuous reflective surface in each mirror segment at a specified scan angle to scan the FOV over a field-of-regard (FOR) such that optical radiation from each point in the FOV does not land on or originate from out-of-phase mirror segments and a diffraction limited resolution of the optical system is limited by the size of the entrance pupil and not by the size of individual mirrors.

2. The optical scanning system of claim 1, wherein a plurality of said MEMS MMAs are arranged to address different portions of the FOR, only one said MEMS MMA being active to scan the FOV over its portion of the FOR, further comprising a fold mirror that selects the active MEMS MMA to propagate optical radiation between the active optical component and the active MEMS MMA.

3. The optical scanning system of claim 2, wherein the fold mirror comprises a secondary MEMS MMA in which the mirrors are responsive to command signals to at least tip and tilt to select the active MEMS MMA.

4. The optical scanning system of claim 3, in which the secondary MEMS MMA is responsive to command signals to partition the secondary MMA into one or more mirror segments, each mirror segment including one or more mirrors, and to at least tip and tilt the mirrors to approximate a continuous reflective surface in each mirror segment at a specified steering angle to select the active MEMS MMA such that optical radiation from each point in the FOV does not land on or originate from out-of-phase mirror segments and a diffraction limited resolution of the optical system is limited by the size of the entrance pupil and not by the size of the mirror segments.

5. The optical scanning system of claim 1, wherein the mirrors tip, tilt and piston in 3 DOF to scan the FOV over the FOR.

6. The optical scanning system of claim 5, wherein responsive to additional command signals the mirrors piston to adjust for path length differences across a wavefront of the optical radiation.

7. The optical scanning system of claim 5, wherein responsive to the command signals the MEMS MMA is partitioned into a single mirror segment including all of the mirrors, wherein the mirrors are tipped, tilted and pistoned to approximate a single continuous reflective surface at the specified scan angle.

8. The optical scanning system of claim 5, wherein the maximum translation of each said mirror to piston is z, wherein responsive to command signals the MEMS MMA is partitioned into a minimum number of mirror segments each having a maximum size as limited by the maximum translation z to approximate the continuous reflective surface at the specified scan angle.

9. The optical scanning system of claim 5, wherein the optical radiation is coherent at specified wavelength, wherein the MEMS MMA responsive to command signals pistons each of a plurality of mirror segments such that the optical path differences between the mirror segments are a multiple of 2*pi times the specified wavelength to maintain phase matching across a wavefront of the coherent optical radiation.

10. The optical scanning system of claim 9, wherein the maximum translation of each said mirror to piston is z, wherein responsive to command signals the MEMS MMA is partitioned into a minimum number of mirror segments each having maximum size as limited by the maximum translation z to approximate the continuous reflective surface at the specified scan angle.

11. The optical scanning system of claim 1, wherein the size of the entrance pupil is less than the size of one mirror segment.

12. The optical scanning system of claim 11, wherein the maximum translation of each said mirror to piston is z, wherein responsive to command signals the MEMS MMA is partitioned into a minimum number of mirror segments each having a maximum size as limited by the maximum translation z to approximate the continuous reflective surface at the specified scan angle.

13. The optical scanning system of claim 1, wherein the one or more MEMS MMAs are positioned at or near an intermediate image plane in the optical system.

14. An optical scanning system, comprising:
   an active optical component including an optical detector or source;
   an optical system including one or more optical elements configured to propagate coherent optical radiation at a specified wavelength focused at a near point at the active optical component and collimated toward a distant conjugate point within a field-of-view (FOV), wherein optical radiation at each point in the FOV passes through an entrance pupil; and one or more Micro-Electro-Mechanical System (MEMS) Micro-Mirror Arrays (MMAs) each comprising a plurality of mirrors, each said MEMS MMA responsive to command signals to partition the MMA into a plurality of mirror segments, each mirror segment including one or more mirrors, and to tip, tilt and piston the mirrors in 3 degrees-of-freedom (DOF) to approximate a continuous reflective surface in each mirror segment at a specified scan angle such that the optical path differences between the mirror segments multiples of 2*pi times the specified wavelength to maintain phase matching across a wavefront of the coherent optical radiation to scan the FOV over a field-of-regard (FOR).

15. An optical scanning system, comprising:
an active optical component including an optical detector or source;
an optical system including one or more optical elements configured to propagate optical radiation focused at a near point at the active optical component and collimated toward a distant conjugate point within a field-of-view (FOV), wherein optical radiation at each point in the FOV passes through an entrance pupil;
a plurality of Micro-Electro-Mechanical System (MEMS) Micro-Mirror Arrays (MMAs) arranged to address different portions of a field-of-regard (FOR), each comprising a plurality of mirrors, and
a fold mirror responsive to command signals to direct optical radiation between the active optical component and one said active MEMS MMA at a time,
said active MEMS MMA responsive to command signals to partition the MMA into a plurality of mirror segments, each mirror segment including one or more mirrors, and to at least tip and tilt the mirrors to approximate a continuous reflective surface in each mirror segment at a specified scan angle to scan the FOV over its portion of the FOR.

16. The optical scanning system of claim 15, wherein responsive to the command signals the active MEMS MMA is partitioned into a single mirror segment including all of the mirrors, wherein the mirrors are tipped, tilted and pistoned to approximate a single continuous reflective surface at the specified scan angle.

17. The optical scanning system of claim 15, wherein the maximum translation of each said mirror to piston is z, wherein responsive to command signals the active MEMS MMA is partitioned into a minimum number of mirror segments each having a maximum size as limited by the maximum translation z to approximate the continuous reflective surface at the specified scan angle.

18. The optical scanning system of claim 15, wherein the optical radiation is coherent at a specified wavelength, wherein the active MEMS MMA responsive to command signals pistons each of a plurality of mirror segments times the specified wavelength to maintain phase matching across a wavefront of the coherent optical radiation.

19. The optical scanning system of claim 15, wherein the size of the entrance pupil is less than the size of one mirror segment.

20. The optical scanning system of claim 15, wherein the one or more MEMS MMAs are positioned at or near an intermediate image plane in the optical system.

\* \* \* \* \*

UNITED STATES PATENT AND TRADEMARK OFFICE
CERTIFICATE OF CORRECTION

PATENT NO. : 12,061,334 B2  
APPLICATION NO. : 17/231898  
DATED : August 13, 2024  
INVENTOR(S) : Knapp et al.

Page 1 of 1

It is certified that error appears in the above-identified patent and that said Letters Patent is hereby corrected as shown below:

In the Specification

In Column 4, Line 30, delete "("TIP")" and insert --("TTP")-- therefor

In Column 4, Line 42, delete "at," and insert --at-- therefor

In Column 6, Line 12, delete "Hz" and insert --KHz-- therefor

In Column 10, Line 55, delete "722," and insert --722.-- therefor

Signed and Sealed this  
Eighth Day of July, 2025

Coke Morgan Stewart  
*Acting Director of the United States Patent and Trademark Office*